(12) United States Patent
Katti et al.

(10) Patent No.: US 8,730,715 B2
(45) Date of Patent: May 20, 2014

(54) TAMPER-RESISTANT MRAM UTILIZING CHEMICAL ALTERATION

(75) Inventors: Romney R. Katti, Shorewood, MN (US); James L. Tucker, Clearwater, FL (US); Anuj Kohli, Apple Valley, MN (US)

(73) Assignee: Honeywell International Inc., Morristown, NJ (US)

( * ) Notice: Subject to any disclaimer, the term of this patent is extended or adjusted under 35 U.S.C. 154(b) by 102 days.

(21) Appl. No.: 13/429,692

(22) Filed: Mar. 26, 2012

(65) Prior Publication Data

US 2013/0250662 A1   Sep. 26, 2013

(51) Int. Cl.
| G11C 11/00 | (2006.01) |
| H01L 23/00 | (2006.01) |
| H01L 23/02 | (2006.01) |
| G11C 11/16 | (2006.01) |

(52) U.S. Cl.
CPC .............. H01L 23/57 (2013.01); H01L 23/573 (2013.01); *G11C 11/16* (2013.01)
USPC ............ 365/158; 257/687; 257/682; 257/678

(58) Field of Classification Search
CPC ....... H01L 23/57; H01L 23/573; G11C 11/16
USPC ............................ 365/158; 257/682, 678, 687
See application file for complete search history.

(56) References Cited

U.S. PATENT DOCUMENTS

| 4,593,384 | A | * | 6/1986 | Kleijne | 365/228 |
| 5,468,990 | A | * | 11/1995 | Daum | 257/632 |
| 5,918,665 | A | * | 7/1999 | Babcock et al. | 165/104.33 |
| 6,505,279 | B1 | * | 1/2003 | Phillips et al. | 711/163 |
| 6,650,564 | B1 | | 11/2003 | Earl et al. | |
| 6,654,278 | B1 | | 11/2003 | Engel et al. | |
| 6,826,086 | B1 | | 11/2004 | Smith et al. | |
| 6,888,773 | B2 | | 5/2005 | Morimoto | |
| 7,065,656 | B2 | * | 6/2006 | Schwenck et al. | 713/194 |
| 7,089,350 | B2 | | 8/2006 | Koren et al. | |
| 7,193,889 | B2 | | 3/2007 | Sharma | |
| 7,353,994 | B2 | * | 4/2008 | Farrall et al. | 235/454 |
| 7,489,013 | B1 | * | 2/2009 | Chubin et al. | 257/417 |
| 7,499,313 | B2 | | 3/2009 | Katti | |
| 7,522,446 | B2 | | 4/2009 | Lee et al. | |
| 7,535,373 | B2 | * | 5/2009 | Dalzell | 340/652 |
| 7,581,118 | B2 | | 8/2009 | McGovern | |
| 7,615,416 | B1 | * | 11/2009 | Chock | 438/127 |
| 7,640,658 | B1 | * | 1/2010 | Pham et al. | 29/846 |
| 7,675,066 | B1 | * | 3/2010 | Dougherty et al. | 257/71 |

(Continued)

OTHER PUBLICATIONS

Kissel et al., "Guidelines for Media Sanitization", NIST Special Publication 800-88, Sep. 2006, 43 pages.

*Primary Examiner* — Viet Q Nguyen
(74) *Attorney, Agent, or Firm* — Shumaker & Sieffert, P.A.

(57) ABSTRACT

A magnetoresistive random access memory (MRAM) die may include an MRAM cell, a reservoir defined by the MRAM die, and a chemical disposed in the reservoir. At least one boundary of the reservoir may be configured to be damaged in response to attempted tampering with the MRAM die, such that at least some of the chemical is released from the reservoir when the at least one boundary of the reservoir is damaged. In some examples, at least some of the chemical is configured to contact and alter or damage at least a portion of the MRAM cell when the chemical is released from the reservoir.

20 Claims, 5 Drawing Sheets

(56) References Cited

U.S. PATENT DOCUMENTS

| | | |
|---|---|---|
| 7,685,438 B2 * | 3/2010 | Knudsen ................. 713/194 |
| 7,705,439 B2 * | 4/2010 | Pham et al. ................. 257/678 |
| 7,710,286 B1 * | 5/2010 | Thornley et al. ............. 340/657 |
| 7,873,870 B2 | 1/2011 | Ohara |
| 7,898,855 B2 | 3/2011 | Merry, Jr. et al. |
| 7,936,603 B2 | 5/2011 | Merry, Jr. et al. |
| 7,995,402 B2 | 8/2011 | Banerjee et al. |
| 8,089,285 B2 * | 1/2012 | Hsu et al. ................. 324/555 |
| 8,169,318 B2 * | 5/2012 | Atherton ................. 340/572.1 |
| 8,288,857 B2 * | 10/2012 | Das et al. ................. 257/687 |
| 8,411,448 B2 * | 4/2013 | Shi et al. ................. 361/748 |
| 8,455,990 B2 * | 6/2013 | Warren et al. ............. 257/678 |
| 8,522,051 B2 * | 8/2013 | Hankhofer et al. ........... 713/194 |
| 2009/0201732 A1 | 8/2009 | Salessi et al. |
| 2011/0026305 A1 | 2/2011 | Reed et al. |
| 2013/0145177 A1 * | 6/2013 | Cordella et al. ............. 713/193 |

\* cited by examiner

TAMPER-RESISTANT MRAM UTILIZING CHEMICAL ALTERATION

TECHNICAL FIELD

The disclosure relates to magnetoresistive random access memory (MRAM), and more particularly, to techniques for hindering tampering with the MRAM.

BACKGROUND

MRAM is a non-volatile memory technology in which data are stored using magnetic domains. Because MRAM is non-volatile, the data stored in the magnetic domains is maintained without requiring power to continually refresh the magnetic domains. Additionally, MRAM may provide desirable read speeds, write speeds, and device longevity. Because of these characteristics, MRAM may be used in a variety of applications, such as long-term storage (e.g., in place of or as a complement to a hard disc drive or a solid state drive), or device memory (e.g., in place of or as a complement to dynamic random access memory (DRAM) and/or static random access memory (SRAM)).

SUMMARY

In general, the disclosure is directed to techniques for deleting data stored by an MRAM die in response to detecting attempted tampering with the MRAM die. In an MRAM die, the data are stored in a plurality of MRAM cells. The MRAM cells include multiple layers, including a free magnetic layer and a fixed magnetic layer. Information is stored in an MRAM cell based on a magnetic orientation of the free magnetic layer relative to a magnetic orientation of the fixed magnetic layer.

In accordance with this disclosure, the MRAM die may define at least one reservoir. The reservoir may contain a chemical, such as an oxidant. When an unauthorized user attempts to access data stored on the MRAM die, the reservoir may be damaged, thereby releasing the chemical. The chemical may contact at least one MRAM cell and alter or damage the MRAM cell. Altering or damaging the MRAM cell may include, for example, rendering the MRAM cell unable to maintain a magnetic state or changing the properties of the MRAM cell such that data cannot be retrieved from the MRAM cell and the data are effectively erased. For example, the chemical may be capable of oxidizing or etching at least one layer in the MRAM cell. In this way, the chemical may delete data stored in at least one MRAM cell, thus changing data stored on the MRAM die. This may prevent an unauthorized user from retrieving the data that was stored on the MRAM die prior to the unauthorized attempt.

In one aspect, the disclosure is directed to an MRAM die that includes an MRAM cell. In accordance to this aspect of the disclosure, the MRAM die may also include a reservoir defined by the MRAM die and a chemical disposed in the reservoir. In some examples, at least one boundary of the reservoir is configured to be damaged in response to attempted tampering with the MRAM die. In some implementations, at least some of the chemical is configured to be released from the reservoir when the at least one boundary of the reservoir is damaged. The chemical may be configured to contact and alter or damage at least a portion of the MRAM cell when the chemical is released from the reservoir.

In another aspect, the disclosure is directed to an MRAM package that includes a substrate and a cover attached to the substrate. The substrate and cover define a cavity. In accordance with this aspect of the disclosure, the MRAM package also includes an MRAM die disposed within the cavity. The MRAM die includes an MRAM cell, a reservoir defined by the MRAM die, a conductor disposed adjacent to the at least one boundary of the reservoir, and a chemical disposed in the reservoir. According to this aspect of the disclosure, the MRAM package further includes circuitry configured to generate a signal in response to determining that the cover has been detached from the substrate. The signal may be configured to damage at least one boundary of the reservoir to release at least some of the chemical from the reservoir, and the chemical may be configured to contact and damage at least a portion of the MRAM cell when the chemical is released from the reservoir.

In a further aspect, the disclosure is directed to forming at least one MRAM cell in an MRAM die, defining at least one reservoir in the MRAM die, and filling the reservoir with a chemical. In accordance with this aspect of the disclosure, the at least one reservoir is configured relative to the at least one MRAM cell so when the at least one boundary of the reservoir is damaged in response to attempted tampering with the MRAM die, at least some of the chemical contacts and damages the at least one MRAM cell.

The details of one or more examples are set forth in the accompanying drawings and the description below. Other features, objects, and advantages will be apparent from the description and drawings, and from the claims.

DETAILED DESCRIPTION

Figure 1:
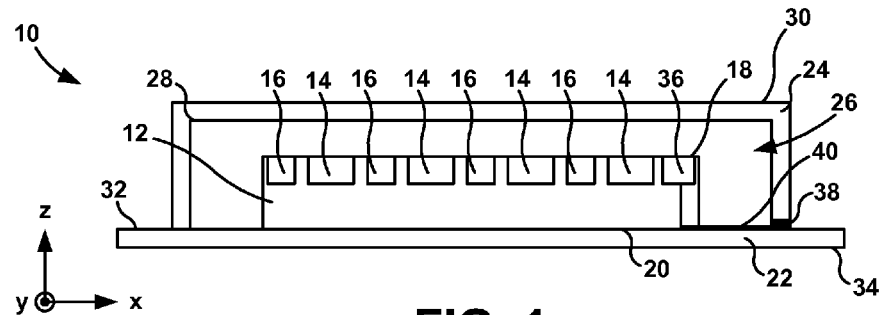
FIG. 1 is a conceptual and schematic cross-sectional diagram that illustrates an example MRAM package that includes a magnetic security structure.

Devices, systems, and techniques for deleting at least some data stored on an MRAM die are described herein. In an MRAM die, the data are stored in a plurality of MRAM cells. The MRAM cells may include multiple layers, including a free magnetic layer and a fixed magnetic layer. Information is stored in an MRAM cell based on a magnetic orientation of the free magnetic layer relative to a magnetic orientation of the fixed magnetic layer. In some examples, the free magnetic layer, fixed magnetic layer, or another layer in the MRAM cell may include a ferromagnetic material.

In accordance with some examples of this disclosure, the MRAM die defines at least one reservoir. The reservoir may include a chemical, such as an oxidant. Example chemicals include water, nitric acid ($HNO_3$), hydrochloric acid (HCl), a mixture of nitric acid and hydrochloric acid (e.g., aqua regia, 1:3 nitric acid:hydrochloric acid, by volume), ferric chloride, nitric acid and an additive, or hydrochloric acid and an additive. Example additives include potassium hydroxide (KOH), sodium hydroxide (NaOH), potassium ferricyanide ($K_4$-[Fe(CN)$_6$].3H$_2$O), picric acid (2,4,6-trinitrophenol, $C_6H_3N_3O_7$), potassium iodide (KI), or water (H$_2$O). Examples of mixtures that can be used as the chemical include nital (a mixture of nitric acid and alcohol, such as methanol or ethanol); alkaline sodium picrate (a mixture of sodium hydroxide (NaOH), picric acid (2,4,6-trinitrophenol, $C_6H_3N_3O_7$), and water, such as 25 grams (g) NaOH, 2 g picric acid, and 75 milliliters (mL) distilled water); Murakami's reagent (a mixture of potassium hydroxide (KOH), potassium ferricyanide ($K_4$[Fe(CN)$_6$].3H$_2$O), and water, such as 10 g KOH, 10 g potassium ferricyanide, and 100 mL distilled water); a 1:1 mixture (by volume) of water and hydrochloric acid (HCl); a 1:1 mixture (by volume) of water and nitric acid (HNO$_3$); a 1:2:10 mixture (by volume) of iodine (I$_2$), potassium iodide (KI), and water; a 1:1:1 mixture of nitric acid (HNO$_3$), acetic acid ($C_2H_4O_2$), and acetone ($C_3H_6O$); 30% (by volume) iron chloride (FeCL$_3$) in water; a 3:1:5:1 mixture (by volume) of nitric acid (HNO$_3$), sulfuric acid (H$_2$SO$_4$), acetic acid ($C_2H_4O_2$), and water; a 3:7 mixture (by volume) of nitric acid (HNO$_3$) and water; a 1:1 mixture (by volume) of nitric acid (HNO$_3$) and acetic acid ($C_2H_4O_2$); a mixture of 1 g diammonium cerium(IV) nitrate (($NH_4$)$_2$Ce(NO$_3$)$_6$) per 10 mL water; hydrofluoric acid (HF) in water; phosphoric acid (H$_3$PO$_4$) in water; nitric acid (HNO$_3$) in water; a mixture of hydrofluoric acid (HF) and nitric acid (HNO$_3$); a 4:1 mixture (by volume) of hydrochloric acid (HCl) and nitric acid (HNO$_3$); a mixture in the ratio of 5 g of diammonium cerium(IV) nitrate (($NH_4$)$_2$Ce(NO$_3$)$_6$) to 1 mL nitric acid (HNO$_3$) to 150 mL water; or a 3:3:1:1 mixture (by volume) of phosphoric acid (H$_3$PO$_4$), nitric acid (HNO$_3$), acetic acid ($C_2H_4O_2$), and water.

When an unauthorized user attempts to access data stored on the MRAM die, the reservoir may be damaged to release at least some of the chemical (e.g., a wall of the reservoir may be damaged). Damage to the wall of the reservoir may include breaching, melting, vaporizing, tearing, puncturing, shearing, or the like. Upon damage to the reservoir, at least some of the chemical may contact at least one MRAM cell. When the chemical contacts the MRAM cell, the chemical may alter or damage the MRAM cell. For example, the chemical may change the magnetic state of the MRAM cell, render at least one layer in the MRAM cell unable to maintain a magnetic state, or change the properties of the MRAM cell such that data cannot be retrieved from the MRAM cell. In some examples, the chemical may alter or damage the MRAM cell in such a manner by oxidizing or etching at least one layer in the MRAM cell. In this way, the chemical may delete data stored in at least one MRAM cell, thus changing data stored on the MRAM die. This may prevent an unauthorized user from retrieving the data that was stored on the MRAM die prior to the unauthorized attempt or retrieving intelligible, meaningful data from the MRAM die. Protection of data stored by the MRAM die in this manner may be useful if, for example, the MRAM die stores confidential information, such as classified information to which access is restricted by law or regulation to particular groups of persons or other intellectual property of an individual or entity.

FIG. 1 is a conceptual and schematic cross-sectional diagram of an example MRAM package 10 in accordance with some aspects of the disclosure. MRAM package 10 includes a substrate 22 and a cover 24. Together, substrate 22 and cover 24 define a cavity 26. Disposed in cavity 26 is an MRAM die 12. In this way, MRAM package 10 encloses MRAM die 12. In some examples, substrate 22 and cover 24 define a substantially fully enclosed cavity 26 (e.g., fully enclosed nor nearly fully enclosed). In other examples, substrate 22 and cover 24 may define a partially enclosed cavity 26. In some instances in which substrate 22 and cover 24 define a substantially fully enclosed cavity 26, substrate 22 and cover 24 may form a hermetic enclosure around MRAM die 12. Although only two portions of the side walls of cover 24 are shown in FIG. 1, in some examples, cover 24 may include sidewalls that extend from a top surface of cover down to substrate 22 to substantially surround die 12. The sidewalls may or may not extend perpendicularly to substrate 22.

Substrate 22 may be formed of any of a variety of materials, such as a metal or alloy, a ceramic, or a plastic. For example, substrate 22 may be formed of alumina (Al$_2$O$_3$), aluminum nitride (AlN), beryllium oxide (BeO), or the like. In some examples, substrate 22 may include at least one electrically conductive pathway (e.g., a trace or via) extending between an internal surface 32 of substrate 22 and an external surface 34 of substrate 22. The at least one electrically conductive pathway may be coupled to electrical circuitry of MRAM die 12 using, for example, a ball grid array, wire bonds, or the like. In this way, the at least one electrically conductive pathway may facilitate electrical communication between MRAM die 12 and circuitry outside of MRAM package 10 (e.g., circuitry defined by other electrical components on a printed board).

Cover 24 may define an internal surface 28 and an external surface 30. Cover 24 also may be formed of any of a variety of materials, such as a metal or alloy, a ceramic, or a plastic. For example, cover 24 may be formed of alumina (Al$_2$O$_3$), aluminum nitride (AlN), beryllium oxide (BeO), or the like.

MRAM die 12 is disposed within package 10, e.g., in cavity 26. MRAM die 12 may be mechanically and electrically connected to substrate 22. For example, electrically conductive pads (not shown) on bottom surface 20 of MRAM die 12 may be soldered to electrically conductive pads (not shown) on internal surface 32 of substrate 22. As another example, bottom surface 20 of MRAM die 12 may be adhered to internal surface 32 of substrate 22 using an adhesive and electrically conductive pads (not shown) on top surface 18 of MRAM die 12 may be wire bonded to electrically conductive pads (not shown) on internal surface 32 of substrate 22.

MRAM die 12 may be formed partially of a semiconductor material, such as, for example, silicon. MRAM die 12 may include other materials, such as dielectric materials (e.g., silicon dioxide (SiO$_2$), silicate glass, or SiOC) and metals or alloys for interconnects between MRAM cells 14 and between MRAM cells 14 and other circuitry in MRAM die 12 and external to MRAM die 12. MRAM die 12 also may include metals or alloys in the magnetic stack of MRAM cells 14, as described below.

MRAM die 12 includes a plurality of MRAM cells 14. Although FIG. 1 shows only one cross-sectional view of MRAM die 12, and hence shows MRAM cells 14 extending along one direction (e.g., the x-axis shown in FIG. 1, where orthogonal x-y-z axes are shown in FIG. 1 for ease of description only), MRAM die 12 may include a two- or three-dimensional array of MRAM cells 14 (e.g., MRAM cells 14 may be arrayed in a two-dimensional layer parallel to the x-y plane shown in FIG. 1).

MRAM cells 14 are the individual structures that are configured to store data magnetically in MRAM die 12. For example, each of MRAM cells 14 may include a fixed magnetic layer, a tunnel barrier layer, and a free magnetic layer (shown in, e.g., FIG. 2A). An orientation of the magnetic moment of the fixed magnetic layer is fixed at the temperatures and external magnetic fields in which MRAM die 12 is designed for use. The orientation of the magnetic moment of the free magnetic layer may be switched by between two states, each state representing a bit (e.g., a 0 or 1).

Figure 2A:
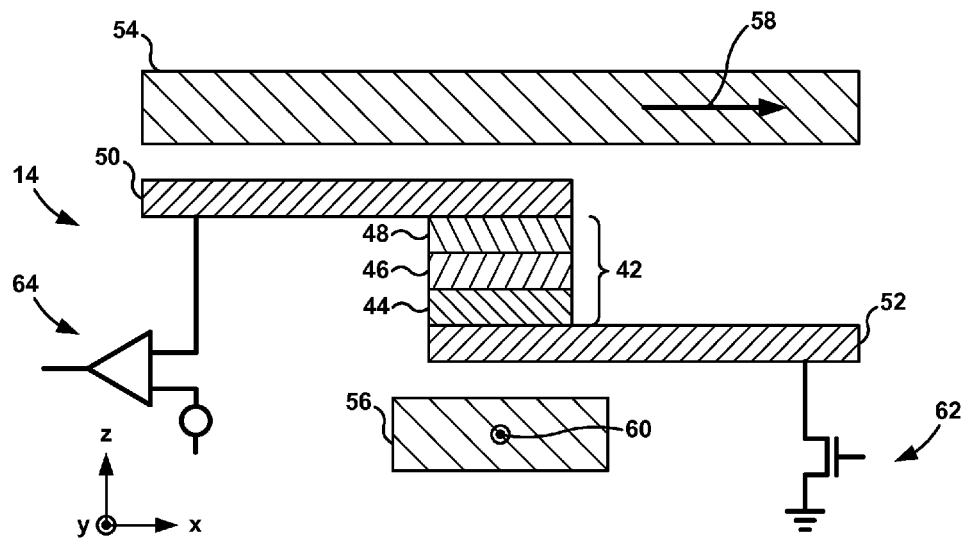
FIGS. 2A-2C are conceptual diagrams that illustrate an example MRAM cell.
Figure 2B:
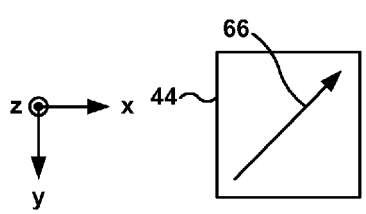
Figure 2C:
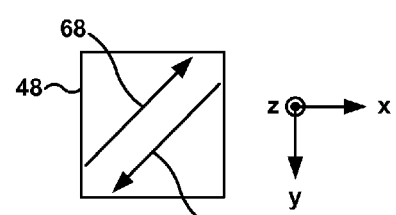

FIGS. 2A-2C are conceptual diagrams that illustrate an example of an MRAM cell 14. In some implementations, as shown in FIGS. 2A-2C, MRAM cell 14 may include a first write line 54 and a second write line 56, which are used to write data to MRAM cell 14. First write line 54 extends generally in the x-axis direction of FIG. 2A (orthogonal x-y-z axes are shown in FIG. 2A for ease of description only), while second write line 56 extends generally in the y-axis direction of FIG. 2A. MRAM cell 14 also includes a magnetic stack 42, which includes a free magnetic layer 48, a tunnel barrier layer 46, and a fixed magnetic layer 44. In some examples, magnetic stack 42 may be referred to as a magnetic tunnel junction (MTJ).

Tunnel barrier layer 46 may include a dielectric, such as an oxide. In some examples, tunnel barrier layer 46 may include aluminum oxide ($Al_2O_3$) or magnesium oxide (MgO).

Fixed magnetic layer 44 includes a pinned magnetic moment 66, illustrated in FIG. 2B. In the illustrated example, pinned magnetic moment 66 is oriented at an approximately 45 degree angle to first write line 54 and second write line 56 (e.g., approximately a 45 degree angle to both the x-axis and y-axis in FIG. 2B, where orthogonal x-y-z axes are shown in the figures for ease of description). In some examples, fixed magnetic layer 44 may include a ferromagnetic metal or alloy, such as, for example, Ni, Fe, or Co, or alloys of Ni, Fe, or Co. Example alloys from which fixed magnetic layer 44 can be formed include NiFe, CoFe, and NiFeCo. In some examples, fixed magnetic layer 44 may be magnetically coupled to an antiferromagnetic layer, which acts to pin the magnetic moment 66 of fixed magnetic layer. The antiferromagnetic layer may include an antiferromagnetic alloy, such as, for example, FeMn, NiMn, IrMn, or PtMn. In some examples, the antiferromagnetic layer may be a bilayer or multilayer, in which the layers have different compositions or magnetic properties.

Free magnetic layer 48 includes a free magnetic moment that is free to rotate under influence of a sufficiently strong applied magnetic field, as illustrated in FIG. 2C. In some examples, free magnetic layer 48 may include a ferromagnetic metal or alloy, such as, for example, Ni, Fe, or Co, or alloys of Ni, Fe, or Co. Example alloys from which free magnetic layer 48 can be formed include NiFe, CoFe, and NiFeCo.

For example, free magnetic layer 48 may have a first free magnetic moment 68 or a second free magnetic moment 70. Free magnetic layer 48 may be switched between first free magnetic moment 68 and a second free magnetic moment 70 by a sufficiently strong magnetic field, such as a magnetic field generated by first write line 54 and second write line 56 or a magnetic field generated by a magnetic security device 16.

For example, the magnetic moment of free magnetic layer 48 may be switched between first free magnetic moment 68 and a second free magnetic moment 70 using first write line 54 and second write line 56. An applied magnetic field may be produced by pulses of electric current flowing through first write line 54 and second write line 56. Consider an example which free magnetic moment begins with the orientation of first free magnetic moment 68. Electric current may be sent through first write line 54 in the direction indicated by arrow 58 (e.g., in the direction of the x-axis of FIG. 2A) and the magnetic moment of free magnetic layer 48 may rotate to be substantially parallel to arrow 58. While electric current still flows through first write line 54, current may be sent through second write line 56 in a direction indicated by arrow 60 (e.g., in the direction of the y-axis of FIG. 2A, out of the plane FIG. 2A), bringing the free magnetic moment to a substantially 45 degree angle between arrows 58 and 60. Current flow through first write line 58 is then ceased, and the free magnetic moment of free magnetic layer 48 rotates to be substantially parallel to the direction of current flow through second write line 56, indicated by arrow 60. Finally, current flow through second write line 56 is ceased, and the free magnetic moment of free magnetic layer 48 rotates to be oriented in the direction indicated by second free magnetic moment 70.

The orientation of free magnetic moment 68, 70 of free magnetic layer 48 relative to the orientation of pinned magnetic moment 66 determines the resistance of magnetic stack 42. For example, the resistance of magnetic stack 42 when pinned magnetic moment 66 and second free magnetic moment 70 are oriented substantially anti-parallel is greater than the resistance of magnetic stack 42 when pinned magnetic moment 66 and first free magnetic moment 68 are oriented substantially parallel (e.g., parallel or nearly parallel). The relative resistance of the magnetic stack 42 may be determined by flowing current from transistor 62 through bottom electrode 52 to magnetic stack 42, through top electrode 50 to operational amplifier (op-amp) 64, where the current is compared to a baseline or standard current. The relative resistance is the storage mechanism of MRAM cells 14. For example, a high resistance may correspond to a logical state of "1," while a low resistance may correspond to a logical state of "0."

Figure 3:
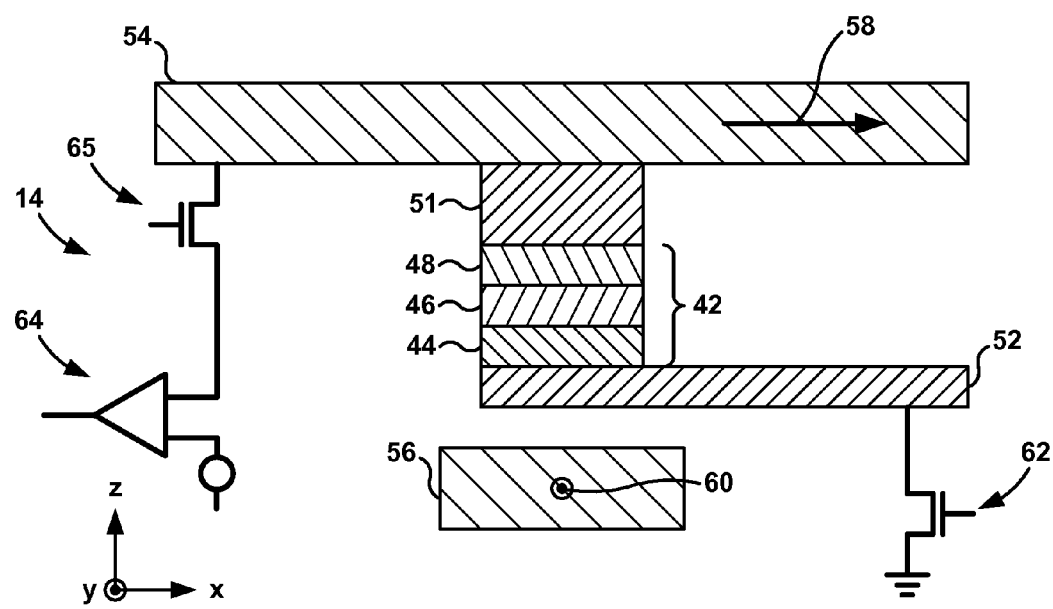
FIG. 3 is a conceptual and schematic cross-sectional diagram that illustrates another example MRAM cell.

FIG. 3 is a conceptual and schematic cross-sectional diagram of another example configuration of MRAM cells 14. The configuration shown in FIG. 3 is similar to the configuration of MRAM cell 14 in FIG. 2A. However, unlike MRAM cell 14 shown in FIG. 2A, MRAM cell 14 shown in FIG. 3 does not include top electrode 52 directly connected to op-amp 64. Instead, a top electrode 51 is electrically connected between first write line 54 and magnetic stack 42. First write line 54 is then electrically connected to a transistor 65, which is electrically connected to op-amp 64. When writing to MRAM cell 14 (e.g., controlling an orientation of magnetic the free magnetic moment of free magnetic layer 48), transistor 65 and transistor 62 may be in an open state, such that op-amp 64 and magnetic stack 42 are isolated from the current flowing through first write line 54. However, when reading the state of MRAM cell 14, the transistors 62 and 65 may be in closed states so current flows from a voltage source, through transistor 62, through bottom electrode 52, through magnetic stack 42, through first write line 54, through transistor 65, and to op-amp 64.

Figure 4:
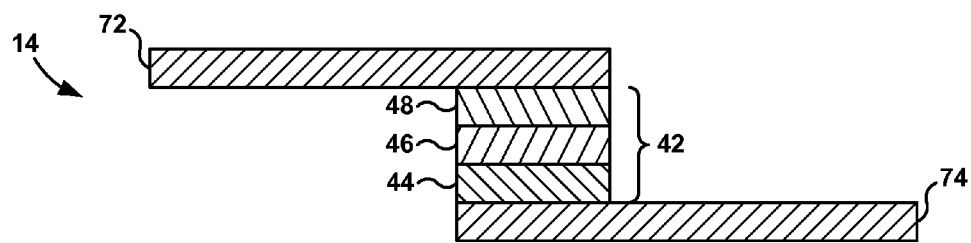
FIG. 4 is a conceptual and schematic cross-sectional diagram that illustrates another example MRAM cell.

FIG. 4 is a conceptual and schematic cross-sectional diagram of another example configuration of MRAM cells 14. In the example illustrated in FIG. 4, MRAM cell 14 is a spin-transfer torque (STT)-MRAM cell. Similar to the example shown in FIGS. 2A-2C, the example MRAM cell 14 shown in FIG. 4 includes a magnetic stack 42 comprising a fixed magnetic layer 44, a tunnel barrier layer 46, and a free magnetic layer 48. The magnetic moment of fixed magnetic layer 44 may be substantially fixed at temperatures and magnetic fields in which MRAM cell 14 will be used. The magnetic moment of free magnetic layer 48 is oriented using spin-oriented current that is directed through magnetic stack 42 using first electrode 72 and second electrode 74. In some examples, the magnetic moment of free magnetic layer 48 may be switched using the spin-oriented current between two, substantially antiparallel states, similar to the configuration in FIGS. 2A-2C. Similar to the example shown in FIGS. 2A-2C, the orientation of the magnetic moment of free magnetic layer 48 relative to the orientation of the magnetic moment of fixed magnetic layer 44 may be determined by measuring the resistance of magnetic stack 42. In some examples, first electrode 72 and second electrode 74 also serve as conduction paths for the process of reading data from MRAM cell 14 (e.g., measuring the resistance of magnetic stack 42). In other examples, MRAM cell 14 may include another conductive pathway electrically connected to magnetic stack to facilitate reading data from MRAM cell 14.

Returning now to FIG. 1, MRAM die 12 also includes at least one reservoir 16. In the example illustrated in FIG. 1, MRAM die 12 includes a plurality of reservoirs 16. As described in further detail below, reservoirs 16 each contain a chemical that is configured to effectively erase data stored by one or more MRAM cells 14 (e.g., all of the MRAM cells 14). At least some of the chemical may be released from reservoirs 16 in response to detected tampering with MRAM die 12, which may be physical tampering (e.g., attempts to physically access die 12 within cavity 26) or electrical tampering (e.g., attempts to electrically access data stored by die 12).

In the example shown in FIG. 1, MRAM die 12 defines at least some of the boundaries of reservoirs 16, e.g., at least some of the walls and/or floors of reservoirs 16. In the example shown in FIG. 1, MRAM die 12 defines the floor, walls, and cover of each of reservoirs 16. For example, during manufacture of MRAM die 12, reservoirs 16 may be etched or otherwise defined in MRAM die 12. As an example, the locations of reservoirs 16 may be defined using a masked pattern on a surface 18 of MRAM die 12, and reservoirs 16 may be etched using plasma etching. Other formation process may be used to define reservoirs 16 in MRAM die 12. In some examples, reservoirs 16 may be formed substantially simultaneously with other features (e.g., transistors and/or interconnects) of MRAM die 12. In other examples, reservoirs 16 may be formed before or after other features of MRAM die 12.

In order to help prevent a chemical reaction between the chemical contained within reservoirs 16 and the other parts of MRAM die 12 prior to the desired time (e.g., prior to the detection of tampering), in some examples, some or all of the surfaces of each of the reservoirs 16 may include a coating that is inert to the chemical contained within reservoir 16. For example, the walls and/or floor (described in further detail with respect to FIG. 5) of reservoirs 16 may include an oxide or a nitride coating. In some examples, the oxide or nitride coating may comprise silicon oxide ($SiO_2$) or silicon nitride (e.g., SiN, $Si_3N_4$, or $Si_2N_3$). In other examples, the silicon or other semiconductor from which MRAM die 12 is formed may be inert to the chemical in reservoir 16 and the walls and/or floor of reservoirs 16 may not include an oxide coating.

Reservoirs 16 also may include a material that forms a cover of reservoirs 16, such that each of reservoirs 16 defines a substantially closed volume (e.g., an entirely closed volume or nearly closed volume) that contains the chemical in the respective one of reservoirs 16. This may further help prevent an inadvertent chemical reaction between the chemical contained within reservoirs 16 and the other parts of MRAM die 12. In some examples, the cover of reservoirs 16 may include a dielectric or other material that in substantially inert to the chemical in reservoirs 16.

As described above, at least one boundary of each of the reservoirs 16 (e.g., a floor, a wall, or a cover) may be configured to be destroyed upon tampering with MRAM die 12 by an unauthorized user. For example, the location of reservoirs 16 within MRAM die 12 may be selected so at least one boundary of reservoirs 16 is damaged during an attempt by an unauthorized user to physically access MRAM cells 14. Damage to the wall of the reservoir may include melting, vaporizing, tearing, puncturing, shearing, or the like. Tampering with MRAM cells 14 may include reverse engineering the contents of MRAM cells 14 and/or the circuitry layout of MRAM die 12. In some cases, reverse engineering may include removing a layer from surface 18 of MRAM die 12 to provide physical access to MRAM cells 14 to allow imaging of MRAM cells 14, e.g., using a microscopy technique. In some instances, at least one boundary of reservoirs 16 may be configured so removal of a layer from surface 18 is likely to damage the at least one boundary. For example, the material that defines the cover of reservoirs 16 may be located near surface 18.

In some implementations, as shown in FIG. 1, MRAM die 12 may include circuitry 36 configured to detect attempted tampering by an unauthorized user with MRAM die 12. In other implementations, another semiconductor die may include circuitry 36, and the other semiconductor die may be enclosed in MRAM package 10 or may be disposed outside MRAM package 10 (e.g., electrically connected to a printed board to which MRAM package 10 is electrically connected). For example, circuitry 36 may include or be electrically connected (by electrical trace 40) to a sensor 38 that is configured to detect removal of cover 24 from substrate 22. In some examples, sensor 38 may be in a different position relative to reservoirs 16 in addition to or instead of the position shown in FIG. 1. For example, sensor 38 may be positioned relative to top surface 30 of cover 24, surface 18 of MRAM die 12, or directly mechanically connected to a cover of one or more reservoirs 16 (e.g., one reservoir or all the reservoirs). In these examples, sensor 38 may be configured to detect attempted physical tampering with cover 24 (e.g., removal of cover 24) or MRAM die 12 (e.g., attempted removal of surface 18 of die 12 to expose MRAM cells 14).

Any suitable sensor 38 (or combination of sensors) may be used. In some examples, sensor 38 may include a thin film sensor configured such that an electrical parameter (e.g., resistance, inductance, or capacitance) or a chemical parameter of sensor 38 changes in response to physical tampering with a portion of MRAM package 10 adjacent sensor 38. A change in the parameter may be correlated to a tamper event. For example, sensor 38 may include one or more strain gauges or stress gauges that are configured to change resistance in response to changes in strain or stress applied to sensor 30. Thus, circuitry 36 may monitor a signal indicative of the resistance of sensor 38 and detect a tamper event when a threshold change in resistance or a threshold resistance is detected. The threshold change in resistance or threshold resistance indicative of an attempted tamper event may be stored by a memory, which may be provided by MRAM die 12 or a memory outside of system 10. In other examples, sensor 38 may change optical properties in response to physical tampering with a portion of MRAM package 10 adjacent sensor 38. Circuitry 36 may, for example, monitor a wavelength of light transmitted through sensor 38 and detect a change in wavelength is detected.

As another example, circuitry 36 may be configured to determine when an unauthorized user attempts to electronically access data stored by MRAM die 12. For example, sensor 38 may include a photo sensor (e.g., light sensor) that detects a presence of an unauthorized user near a device (e.g., a computer) that includes MRAM die 12. Circuitry 36 may interpret the unauthorized presence of the person as an attempt to tamper with data stored by MRAM die 12. In some examples, circuitry 36 may be configured to detect electrical activity indicating attempted tampering with MRAM die 12 due to an access control violation. For example, data stored by MRAM die 12 may be password protected or protected by an access code. After a predetermined number of failed password or access code entries, circuitry 36 may determine than an unauthorized user is attempted to access data stored by MRAM die 12.

In response to detecting tampering (physical, electronic, or both) with MRAM die 12, circuitry 36 may be configured to generate a signal, such as a current or voltage pulse, that damages or destroys at least one boundary of reservoirs 16. In other examples, the signal generated by circuitry 26 may not directly damage or destroy at least one boundary of reservoirs 16. Instead, the signal may be sent to a microelectromechanical system (MEMS) device, a piezoelectric crystal, or another device, which acts to damage or destroy the at least one boundary of reservoirs 16 in response to the signal. For example, the piezoelectric crystal may damage or destroy the at least one boundary of reservoirs 16 using vibration. The MEMS device may damage or destroy the at least one boundary of reservoirs 16 using vibration or impact (e.g., puncture).

In some instances, MRAM die 12 may not include circuitry 36 (e.g., MRAM die 12 shown in FIG. 5), and, instead, circuitry outside of die 12 (e.g., provided by an integrated circuit within cavity 26 or outside of cavity 26) may be used to detect tampering with system 10 and, in response, generate the signal, such as a current or voltage pulse, that damages or destroys at least one boundary of reservoirs 16 or causes a device to damage or destroy the at least one boundary of reservoirs 16.

Regardless of whether the at least one boundary of reservoirs 16 is destroyed in response to a signal or due to physical tampering, the destruction of the at least one boundary may release at least some of the chemical stored in at least one of reservoirs 16. The chemical may be configured to etch, oxidize, or otherwise alter or damage at least a portion of MRAM cells 14 to the extent that data stored by MRAM cells 14 is changed, deleted, or otherwise effectively erased. For example, the chemical may be configured to oxidize (e.g., rust) a ferromagnetic material in magnetic stack 42, such as free magnetic layer 48 and/or fixed magnetic layer 44. When free magnetic layer 48 and/or fixed magnetic layer 44 are oxidized, the respective layer may no longer maintain a magnetic orientation, and the information stored by the MRAM cell 14 may be irretrievable. Additionally or alternatively, the chemical may be configured to alter or damage top electrode 50 and/or bottom electrode 50, or first electrode 72 and/or second electrode 74. Altering or damaging top electrode 50 and/or bottom electrode 50, or first electrode 72 and/or second electrode 74 may prevent retrieval of data stored in MRAM cell 14. Thus, the chemical may effectively prevent tampering with (e.g., unauthorized retrieval of) the information stored by MRAM cells 14.

Figure 5:
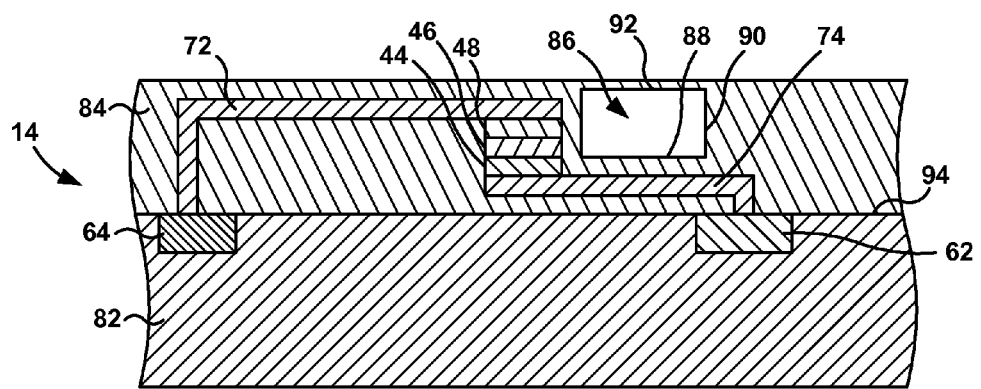
FIG. 5 is a conceptual and schematic cross-sectional diagram that illustrates an example MRAM cell and an adjacent reservoir.

FIG. 5 is a conceptual cross-sectional diagram that illustrates an example configuration of a reservoir 16 relative to an MRAM cell 14. As described above, reservoir 16 may be disposed relative to MRAM cell 14 such that destruction of at least one boundary of reservoir 16 releases at least some of a chemical enclosed in reservoir 16 and causes the chemical to contact a portion of MRAM cell 14. The chemical may alter or damage a portion of the MRAM cell 14 that it contacts, changing the data stored in the MRAM cell 14 and/or rendering the data unretrievable. By altering or damaging a portion of MRAM cell 14, access to the original data (e.g., data stored on MRAM die 12 before tampering) may be made more difficult or may be prevented. Protection of data stored by MRAM die 12 with the magnetic security structure in this manner may be useful if, for example, MRAM die 12 stores confidential information, intellectual property, or other such information.

As shown in FIG. 5, MRAM die 12 includes a semiconductor substrate 82. Semiconductor substrate 82 may be formed of any suitable semiconductive material, such as silicon (Si) or gallium arsenide (GaAs). Semiconductor substrate 82 includes defined therein a transistor 62 and an op-amp 64. Transistor 62 is electrically connected to second electrode 74. Op-amp 64 is electrically connected to first electrode 72.

MRAM die 12 also includes dielectric 84. Dielectric 84 is disposed on surface 94 of semiconductor substrate 82. Dielectric 84 substantially surrounds (e.g., completely surrounds or nearly completely surrounds) the metal or alloy layers of an MRAM cell (e.g., MRAM cell 14). For example, as shown in FIG. 5, dielectric 84 substantially surrounds first electrode 72, second electrode 74, fixed magnetic layer 44, tunnel barrier layer 46, and free magnetic layer 48. Dielectric 84 provides electrical insulation for materials in dielectric 84, e.g., first electrode 72 and second electrode 74. Dielectric 84 may include any suitable electrically insulating material, such as, for example, silicon dioxide ($SiO_2$), silicate glass, SiOC, or another dielectric material.

Dielectric 84 also may define reservoir 86. For example, as shown in FIG. 5, dielectric 84 may define floor 88, walls 90, and cover 92 of reservoir 86. When reservoir 86 defines a different shape, dielectric 84 may define the boundaries of the other shape; i.e., regardless of the shape of reservoir 86, dielectric 84 may define the boundaries of reservoir 86.

Reservoir 86 may be defined in dielectric 84 in a location relative to MRAM cell 14 (e.g., first electrode 72, second electrode 74, fixed magnetic layer 44, tunnel barrier layer 46, and free magnetic layer 48) so that when a boundary of reservoir 86 is damaged (e.g., in response to tampering with MRAM die 12 or MRAM package 10 of FIG. 1) at least some of the chemical disposed in reservoir 86 is released and contacts at least one component of MRAM cell 14. For example, as shown in FIG. 5, reservoir 86 is next to magnetic stack 42 and above (in the z-axis direction) second electrode 74. Other configurations of reservoir 86 and MRAM cell 14 are also possible and are within the scope of this disclosure.

Figure 6:
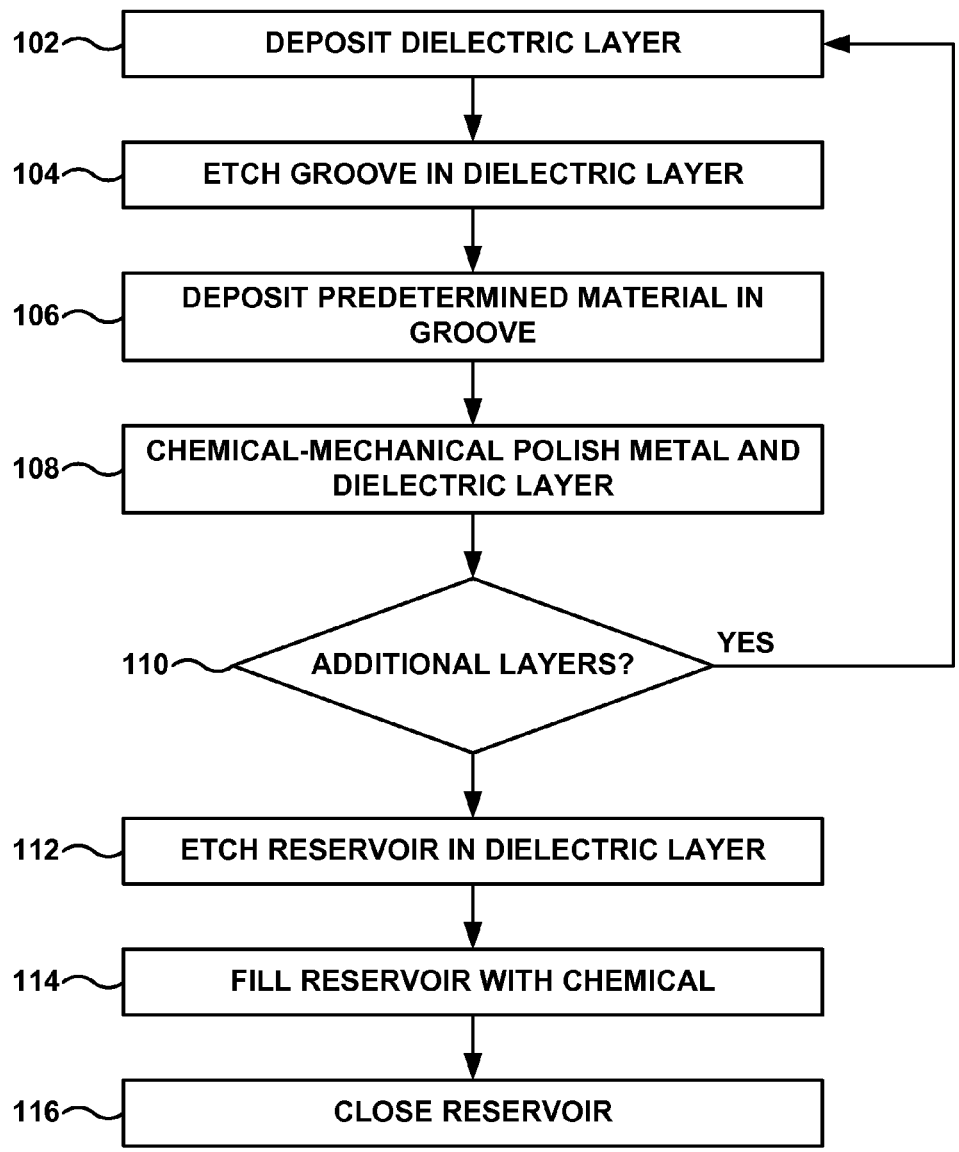
FIG. 6 is a flow chart that illustrates an example technique for forming the example MRAM die shown in FIG. 5.

Dielectric 84, first electrode 72, second electrode 74, fixed magnetic layer 44, tunnel barrier layer 46, and free magnetic layer 48 may be formed using any suitable process. For example, dielectric 84, first electrode 72, second electrode 74, fixed magnetic layer 44, tunnel barrier layer 46, and free magnetic layer 48 may be formed using an additive process, such as a Damascene process or a dual Damascene process, or a subtractive process, such as subtractive aluminizing. FIG. 6 is a flow diagram that illustrates an example Damascene process for forming dielectric 84, first electrode 72, second electrode 74, fixed magnetic layer 44, tunnel barrier layer 46, and free magnetic layer 48 may be formed using any suitable process.

The technique shown in FIG. 6 generally includes fabricating elements of MRAM die 12, such as by depositing a dielectric layer (102), etching a groove in the dielectric layer (104), depositing a predetermined material in the groove to form a predetermined structure (106), and chemical mechanical polishing (CMP) the predetermined material and the dielectric layer to form a substantially planar surface (108). This process may be repeated for each additional layer of material in the structure, e.g., in the magnetic stack (see decision block (110)). An example of the technique shown in FIG. 6 will be described with reference to FIG. 5. However, the technique shown in FIG. 6 may be extended or modified to produce MRAM dice 12 having configuration other than that shown in FIG. 5.

In an example for forming the MRAM die 12 of FIG. 5, the technique of FIG. 6 may include depositing a first dielectric layer on surface 94 of semiconductor substrate 82 (102). The first dielectric layer may be formed to a predetermined thickness, which may be based on, for example, requirements for electrical isolation between the transistors (e.g., transistor 62) and the interconnect or electrode to be formed on and through the dielectric layer (e.g., second electrode 74). The first dielectric layer may be formed using any suitable process, including, for example, chemical vapor deposition (CVD) or spin coating. The dielectric layer may include, for example, $SiO_2$, SiOC, silicate glass, or the like.

Once the first dielectric layer has been formed (102), the first dielectric layer is masked to define a shape of a groove that corresponds to a desired shape of an electrode (e.g., a portion of first electrode 72 and second electrode 74 and a portion of first electrode 72). The groove then is etched in the first dielectric layer (104). The groove may include substantially vertical (e.g., vertical or nearly vertical) portions and/or a substantially horizontal (e.g., horizontal or nearly horizontal) portions. In some examples, the masking and etching may define at least two grooves (e.g., one groove for first electrode 72 and a second groove for second electrode 74). In some examples, the masking and etching may occur in two steps to define the substantially vertical portions and the substantially horizontal portion of the groove (e.g., the groove for second electrode 74).

The groove may be etched using an etchant that selectively etches oxides but does not etch silicon, which may help prevent damage to the transistors (e.g., transistor 62 and/or op-amp 64). For example, the groove may be etched using buffered hydrofluoric acid (BHF; a mixture of a buffering agent such as ammonium fluoride ($NH_4F$) and hydrofluoric acid (HF)) or dry plasma etching techniques.

After the groove has been etched in the first dielectric layer, a predetermined material is deposited in the groove (106). The type of predetermined material that is deposited may depend on the element of the MRAM die being formed. When the groove defines a position of an electrode (e.g., first electrode 72 or second electrode 74), the predetermined material includes an electrically conductive material, such as copper. In some examples, excess material is deposited in the groove such that the material overflows the groove and some material is disposed on a surface of the first dielectric layer. The predetermined material may be deposited in the groove using any suitable process, including, for example, CVD and/or electroplating.

Once the predetermined material has been deposited in the groove (106), the excess material is removed and a substantially planar (e.g., planar or nearly planar) surface of the copper and the first dielectric layer is formed using chemical mechanical polishing (CMP) (108).

Because the MRAM die 12 includes additional layers of material (110), the process repeats. A second dielectric layer is deposited over the first dielectric layer and the groove(s) filled with the predetermined material (102). A shape of at least one groove is then masked on the second dielectric layer, and the groove is etched in the second dielectric layer (104). For example, a first groove corresponding to the shape of first electrode 72 and a second groove corresponding to a shape of fixed magnetic layer 44 may be etched in the second dielectric layer (104). The grooves are then filled with the corresponding predetermined materials (106), e.g., an electrically conductive material in the groove for the first electrode 72 and a ferromagnetic material in the groove for fixed magnetic layer 44. The predetermined materials and the second dielectric layer then may be polished using CMP to form a substantially planar surface (108).

This process may be repeated for the tunnel barrier layer 46, the free magnetic layer 48, and the first electrode 72. Once no more layers are to be formed (the "NO" branch of decision block (110), the process continues by etching reservoir 86 in the dielectric layer 84 (112). (Dielectric layer 84 was formed during the previous steps of the process by the dielectric layers deposited in each step of the process.) Similar to the above description, dielectric layer 84 is masked to define a shape that corresponds to a desired shape of reservoir 86. Reservoir 86 then is etched in the dielectric layer 84. Dielectric layer 84 may be etched using an etchant that selectively etches oxides, which may help prevent damage to other components of MRAM die 12. For example, dielectric layer 84 may be etched using buffered hydrofluoric acid (BHF; a mixture of a buffering agent such as ammonium fluoride ($NH_4F$) and hydrofluoric acid (HF)) or dry plasma etching techniques.

Once reservoir 86 is defined (112), reservoir 86 may be filled with a predetermined chemical (114). In some examples, as described above, the chemical may be an oxidizer configured to oxidize at least one layer in magnetic stack 42 when the at least one layer in magnetic stack 42 is exposed to the chemical. Once the chemical has been deposited in reservoir 86, reservoir 86 may be sealed (116). In some examples, reservoir 86 may be sealed using an oxide layer similar to the oxide in dielectric 84. In other examples, reservoir 86 may be sealed using another material.

By forming reservoir 86 in dielectric 84, reservoir 86 may be disposed in MRAM die 12 so at least some of a chemical enclosed in reservoir 86 is released upon damage to a boundary of reservoir 86 (e.g., walls 90 or cover 92). Because of the configuration of reservoir 86 relative to MRAM cell 14 (e.g., magnetic stack 42, first electrode 72 and/or second electrode 74), the chemical may contact a portion of the MRAM cell 14 and alter or damage the MRAM cell 14. Alteration or damage to the MRAM cell 14 may include, for example, physical or magnetic damage to a structure within MRAM cell 14 that causes data stored in the MRAM cell 14 to change or not be retrievable. For example, altering or damaging MRAM cell 14 may include rendering the MRAM cell unable to maintain a magnetic state or changing the properties of the MRAM cell such that data cannot be retrieved from the MRAM cell. In this way, reservoir 86 and the chemical contained therein may reduce or substantially prevent an unauthorized user from accessing the original data stored on MRAM die 12 (e.g., data stored on MRAM die 12 before tampering).

Figure 7:
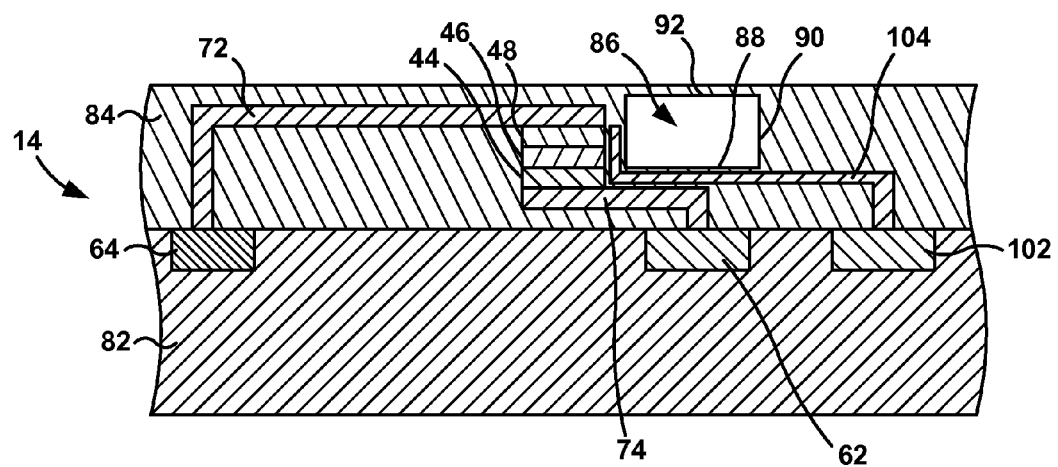
FIG. 7 is a conceptual and schematic cross-sectional diagram that illustrates another example MRAM cell, an adjacent reservoir, and circuitry for sensing an unauthorized attempt at accessing data stored by an MRAM die.

FIG. 7 is a conceptual and schematic cross-sectional diagram of a portion of another example of an MRAM die 12 in accordance with aspects of this disclosure. MRAM die 12 in FIG. 7 may be similar to MRAM die 12 shown in FIG. 5. In contrast to MRAM die 12 of FIG. 5, MRAM die 12 in FIG. 7 includes circuitry 102 and conductor 104.

Circuitry 102 may be configured to detect attempted tampering with MRAM die 12 (and/or MRAM package 10, shown in FIG. 1). For example, circuitry 102 may be electrically connected to at least one sensor (e.g., sensor 38 shown in FIG. 1). The at least one sensor may be configured to sense events that indicate attempted tampering with MRAM die 12 and generate a signal indicative of such attempted tampering and receivable by circuitry 102. For example, the at least one sensor may include a simple electrical circuit that is closed when cover 24 (FIG. 1) is attached to substrate 22 (FIG. 1) and is open when cover 24 is detached from substrate 22. In this way, the at least one sensor may sense when cover 24 is removed from substrate 22. Circuitry 102 may be programmed to interpret removal of cover 24 from substrate 22 as an attempt to tamper with MRAM die 12.

The at least one sensor may include any additional or alternative sensor, such as a pressure sensor, a photo sensor (e.g., light sensor), or the like, which can generate a signal indicating attempted tampering with MRAM package 10 (FIG. 1) and/or MRAM die 12.

In some examples, circuitry 102 may be configured to detect electrical activity indicating attempted tampering with MRAM die 12. For example, data stored by MRAM die 12 may be password protected. After a predetermined number of failed password entries, circuitry 102 may determine than an unauthorized user is attempted to access data stored by MRAM die 12.

Regardless of the method by which circuitry 102 determines that an unauthorized user is attempting to tamper with MRAM die 12, circuitry 102 may generate a signal in response to detecting attempted tampering. For example, circuitry 102 may generate a voltage or current signal (e.g., a pulse) and conduct the signal via conductor 104. The voltage or current signal may be of sufficient amplitude (or intensity) to damage or substantially destroy a portion of dielectric 84 (e.g., adjacent to floor 88 or wall 90 of reservoir), where the substantial destruction of the portion of dielectric 84 causes at least some of the chemical contained within reservoir 16 to be released and penetrate through die 12 to MRAM cell 14. The substantial destruction may include, for example, causing dielectric 84 to change structure, such as by cracking, breaking, perforating, dissipating (e.g., in response to an exothermic reaction between the chemical and dielectric 84), melting, vaporizing, or the like. In this way, circuitry 102 (and, optionally, sensor 38 shown in FIG. 1) may provide a mechanism for releasing at least some of the chemical from reservoir 84 and exposing at least one component of MRAM cell 14 (e.g., first electrode 72, second electrode 74, free magnetic layer 48, tunnel barrier layer 46, or fixed magnetic layer 44) to the chemical. As described above, exposing at least one component of MRAM cell 14 to the chemical may alter or damage the at least one component of MRAM cell 14. Altering or damaging the at least one component of MRAM cell 14 may make access to the original data (e.g., data stored on MRAM die 12 before tampering) more difficult or may prevent access to the original data. Protection of data stored by MRAM die 12 with the magnetic security structure in this manner may be useful if, for example, MRAM die 12 stores confidential or proprietary information.

Circuitry 102 and/or the at least one sensor may be responsive to attempted tampering via direct physical access or electronic access to MRAM die 12 (e.g., data stored by MRAM cells 14). Hence, in some examples, an MRAM die 12 that includes circuitry 102 and/or at least one sensor may provide more flexible protection from tampering than an MRAM die 12 that does not include circuitry 102 and/or at least one sensor.

Various examples have been described. These and other examples are within the scope of the following claims.

What is claimed is:

1. A magnetoresistive random access memory (MRAM) die comprising:
   an MRAM cell comprising at least one layer comprising a ferromagnetic material;
   a reservoir defined by the MRAM die, wherein at least one boundary of the reservoir is configured to be damaged in response to attempted tampering with the MRAM die; and
   a chemical disposed in the reservoir, wherein at least some of the chemical is configured to be released from the reservoir when the at least one boundary of the reservoir is damaged, and wherein the chemical comprises an oxidant and is configured to contact and oxidize the ferromagnetic material when the chemical is released from the reservoir.

2. The MRAM die of claim 1, wherein the at least one boundary of the reservoir comprises a dielectric disposed between the chemical in the reservoir and the MRAM cell.

3. The MRAM die of claim 1, wherein the oxidant comprises at least one of hydrochloric acid, nitric acid, or ferric chloride.

4. The MRAM die of claim 1, further comprising a conductor and circuitry configured to:
   detect an attempt to tamper with the MRAM die; and
   generate an electrical signal in response to the attempt, wherein the electrical signal is configured to damage the at least one boundary of the reservoir.

5. The MRAM die of claim 4, wherein the circuitry is configured to detect an unauthorized attempt to electrically access data stored by the MRAM die.

6. The MRAM die of claim 4, wherein the circuitry is configured to detect an unauthorized attempt to physically access the MRAM die.

7. The MRAM die of claim 1, wherein the at least one boundary of the reservoir is configured to be damaged by an attempt to physically access the MRAM die.

8. The MRAM die of claim 1, wherein the MRAM die comprises a semiconductor substrate and a dielectric formed on the semiconductor substrate, and wherein the reservoir is defined by the dielectric.

9. A magnetoresistive random access memory (MRAM) package comprising:
   a substrate;
   a cover attached to the substrate, wherein the substrate and cover define a cavity;
   an MRAM die disposed within the cavity, wherein the MRAM die comprises:
      an MRAM cell comprising at least one layer comprising a ferromagnetic material,
      a reservoir defined by the MRAM die,
      a conductor disposed adjacent to the at least one boundary of the reservoir, and
      a chemical disposed in the reservoir, wherein the chemical comprises an oxidant; and
   circuitry configured to generate a signal in response to determining the cover has been detached from the substrate, wherein the signal is configured to damage at least one boundary of the reservoir to release at least some of the chemical from the reservoir, and wherein the chemical is configured to contact and oxidize the ferromagnetic material when the at least some of the chemical is released from the reservoir.

10. The MRAM package of claim 9, wherein the oxidant comprises at least one of hydrochloric acid, nitric acid, or ferric chloride.

11. The MRAM package of claim 9, wherein the circuitry is further configured to:
   detect an unauthorized attempt to electrically access data stored by the MRAM die; and
   generate the signal in response to the unauthorized attempt to electrically access data stored by the MRAM die.

12. The MRAM package of claim 9, wherein the MRAM die comprises a semiconductor substrate and a dielectric formed on the semiconductor substrate, and wherein the reservoir is defined by the dielectric.

13. A method comprising:
   forming at least one magnetoresistive random access memory (MRAM) cell in an MRAM die comprising at least one layer comprising a ferromagnetic material;
   defining at least one reservoir in the MRAM die; and
   filling the reservoir with a chemical, wherein the chemical comprises an oxidant, and wherein the at least one reservoir is configured relative to the at least one MRAM cell so when the at least one boundary of the reservoir is damaged in response to attempted tampering with the MRAM die, at least some of the chemical contacts and oxidizes the ferromagnetic material.

14. The method of claim 13, wherein defining the at least one reservoir in the MRAM die comprises forming a dielectric on a semiconductor substrate, and defining the at least one reservoir in the dielectric.

15. The method of claim 13, further comprising:
   forming a conductor in the MRAM die adjacent to the at least one boundary of the reservoir; and
   forming circuitry in the MRAM die, wherein the circuitry is configured to detect an attempt to tamper with the MRAM die and generate an electrical signal in response to the attempt, wherein the electrical signal is configured to damage the at least one boundary of the reservoir.

16. The method of claim 13, wherein the oxidant comprises at least one of hydrochloric acid, nitric acid, or ferric chloride.

17. The MRAM package of claim 11, wherein the circuitry is further configured to detect an unauthorized attempt to electrically access data stored by the MRAM die.

18. The MRAM package of claim 11, wherein the circuitry is further configured to detect an unauthorized attempt to physically access the MRAM die.

19. The MRAM package of claim 9, wherein the at least one boundary of the reservoir is configured to be damaged by an attempt to physically access the MRAM die.

20. The method of claim 15, wherein the attempt to tamper with the MRAM die is an unauthorized attempt to electrically or physically access the MRAM die.

* * * * *